United States Patent [19]

Martin et al.

[11] 4,263,534
[45] Apr. 21, 1981

[54] SINGLE SIDED SUSTAIN VOLTAGE GENERATOR

[75] Inventors: William J. Martin, Lake Katrine; Bergert G. Kleen, Kingston, both of N.Y.

[73] Assignee: International Business Machines Corporation, Armonk, N.Y.

[21] Appl. No.: 110,314

[22] Filed: Jan. 8, 1980

[51] Int. Cl.³ .............................................. H05B 41/14
[52] U.S. Cl. .................................. 315/169.4; 340/805
[58] Field of Search ...................... 315/169.4; 365/116; 340/777, 805, 811

[56] References Cited

U.S. PATENT DOCUMENTS

| | | | |
|---|---|---|---|
| 4,128,901 | 12/1978 | Miller | 365/116 |
| 4,140,944 | 2/1979 | Miller | 340/777 |
| 4,200,822 | 4/1980 | Miller | 315/169.4 |

Primary Examiner—Eugene R. La Roche
Attorney, Agent, or Firm—Sughrue, Rothwell, Mion, Zinn & Macpeak

[57] ABSTRACT

A singled-sided sustain voltage generator provides a 0 to 200 volt swing using only four 100 volt FET's. The output of the circuit is applied to one side of the display panel, the other side being applied to ground potential. The circuit can provide either a 200 volt peak-to-peak square wave, or a return to midpoint waveform by selectively controlling the four FET's.

3 Claims, 3 Drawing Figures

SINGLE SIDED SUSTAIN VOLTAGE GENERATOR

FIELD OF THE INVENTION

This invention relates to an apparatus for producing sustain voltages in gas discharge display panel devices. The circuitry generally disclosed herein finds particular utility in conjunction with the techniques disclosed in the commonly assigned copending U.S. Application Ser. No. 110,313, to Kleen et al, filed on the same date herewith and incorporated herein by reference.

BACKGROUND OF THE INVENTION

Gas discharge display panels are provided with circuitry for producing a sustain voltage (typically 200 v) which is applied to each of the discharge cells in the display panel. The sustain voltage causes selected panel areas to discharge at a rate determined by the sustain voltage frequency. In this manner, the selected panel area has the appearance of being continuously illuminated.

A problem associated with the use of large gas discharge display panels is that of power consumption and generation of large sustain voltages. Sustain waveform generator circuits for large gas panel displays can be designed to use power MOS-FET's rather than bipolar transistors to thereby reduce power consumption and avoid the storage and gain problems associated with high voltage-high current bipolar transistors. The use of low cost power MOS-FET's would therefore reduce system hardware and operating costs. Unfortunately, 200 volt FET's are not readily available and have not been found to provide satisfactory operation in a sustain driver.

Four 100 volt FET's in a bridge configuration as illustrated in FIG. 1 can provide a 200 volt swing using a single 100 volt source. While FET's are shown in FIG. 1, bipolar transistors can alternatively be employed as in the case of the IBM 240/480 Gas Panel Program. The voltage is alternatively delivered from one of FET's 10 or 20 to one of driver modules 30 or 35. One of the FET's 15 or 25 is provided to ground the other of the two driver modules 30 or 35 such that when FET 10 is biased "on" to provide source voltage to horizontal driver 30, FET 20 is biased "off" and FET 25 is biased "on" to place the vertical driver module 35 at ground potential. FET 15 must be biased "off" so that the horizontal axis can float to provide the required 100 volt potential between horizontal and vertical driver modules 30 and 35. The 200 volt voltage swing across panel cell 40 is accomplished by reversing the biases on FET's 10, 15, 20 and 25. While this technique will provide the proper voltage to sustain the cell discharge, it requires that both the horizontal and vertical axes float. This greatly increases the vertical data load time and thus the panel update time.

SUMMARY OF THE INVENTION

An object of the present invention is to provide a sustain circuit which produces a unipolar voltage swing of from zero to approximately 200 volts across the display panel cells (single-sided sustainer).

A further object of the present invention is to provide a sustain circuit which produces a unipolar voltage swing of from 0 to 200 volts employing only four 100 volt power MOS-FET's.

A further object of the present invention to provide a sustain circuit which produces a unipolar voltage swing of from 0 to 200 volts whereby the application of the 0 to 200 volt sustain waveform to one side of the display panel allows the other side of the display panel to be at ground potential.

DETAILED DESCRIPTION OF THE INVENTION

Figure 1:
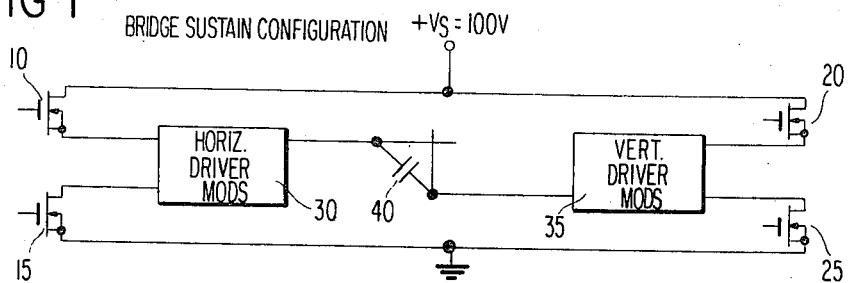
FIG. 1 is a schematic illustration of a bridge circuit for providing a bipolar 200 volt swing across a display panel discharge cell.
Figure 2:
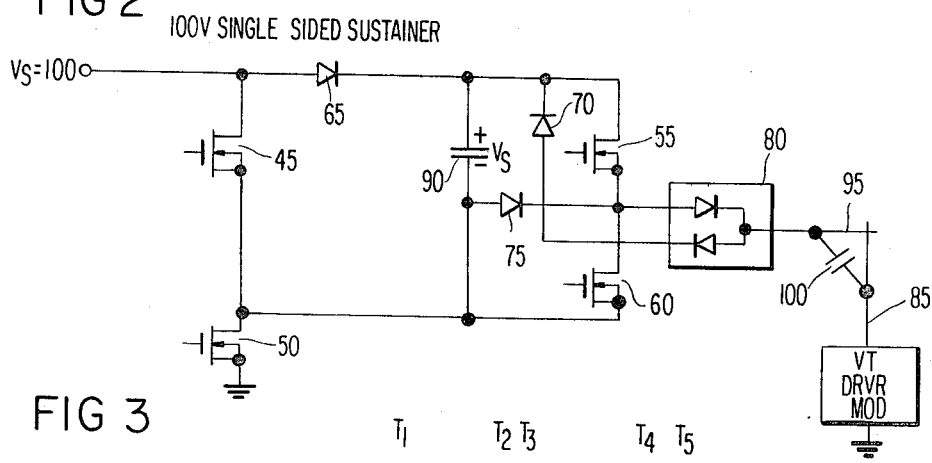
FIG. 2 is a schematic illustration of a single-sided sustain unit in accordance with the present invention.

FIG. 2 illustrates the 100 volt single-sided sustainer circuit in accordance with the present invention. The circuit of FIG. 2 is deemed "single-sided" since a 0-200 volt swing is produced at output line 95, rather than alternatively applying 100 volts to either side of the panel cell as in the FIG. 1 arrangement. In this manner, the single-sided sustainer circuit provides the requisite 200 volt swing to sustain the cell discharge using 100 volt FET's, and allows the vertical axis to be tied to ground.

Figure 3:
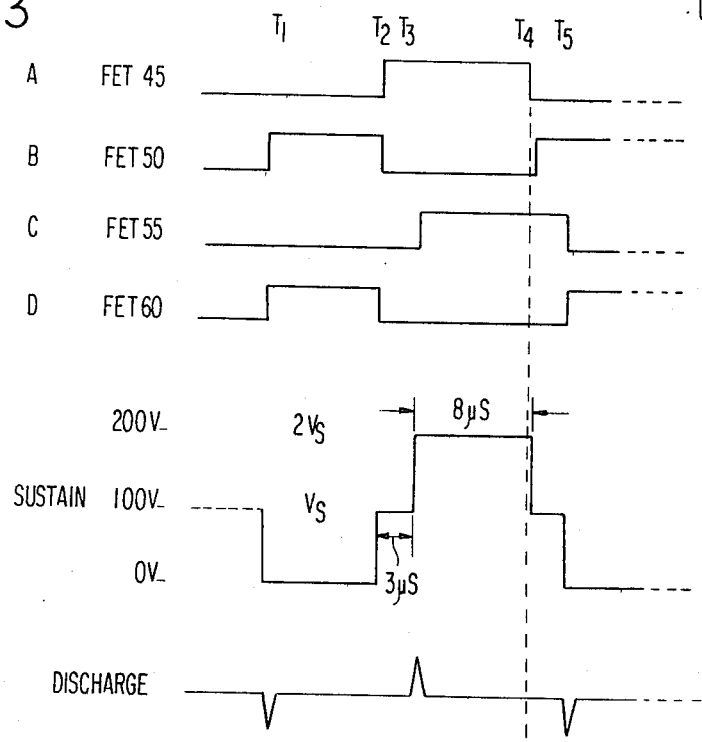
FIG. 3 is a timing diagram for control of FET's in the sustain circuit. The sustain voltage and discharge waveforms produced by the sustain circuit are also shown.

With reference to FIGS. 2 and 3, operation of the single-sided sustainer circuit will be described. Initially, at time T1, FET's 50 and 60 are biased "on", while FET's 45 and 55 are biased "off". The horizontal panel line 95 will be applied to ground through the horizontal driver module 80 and the sustain voltage as shown in FIG. 3 will be applied to the panel cell to cause discharge of energized cell 100. Capacitor 90 is also charged to the source voltage through diode 65 and FET 50. At time T2, FET's 50 and 60 are biased "off" while FET 45 is biased "on" to thereby charge the line 95 to the source voltage through FET 45 and diode 75. The sustain voltage is then increased from the source voltage $V_s$ to twice $V_s$ by biasing FET 55 "on" at time T3. The voltage $2V_s$ is applied to the line 95 through FET's 45 and 55 and capacitor 90 which was previously charged to 100 volts. A positive discharge within energized cell 100 occurs at the 100 to 200 volt transition at time T3. At time T4, the sustain waveform is returned to the 100 volt level by first biasing "off" FET 45, then biasing "on" FET 50 to discharge the line 95 to the voltage across capacitor 90 (100 volts) through diode 70, capacitor 90, and FET 50. The process is repeated at time T5 by biasing FET 55 "off" and FET 60 "on" to produce the initial conditions as at time T1.

It may also be observed that the single-sided sustainer circuit of FIG. 2 may be operated in a manner to provide a 200 volt peak-to-peak square wave without the return to 100 volt midpoint feature. This is accomplished by operating FET 55 at the same time as FET 45 such that both FET's 45 and 55 are biased "on" whenever FET's 50 and 60 are biased "off", and vice versa. Initially, with FET's 50 and 60 biased "on" and 45 and 55 biased "off", the horizontal line 95 will be pulled through the horizontal driver module to ground, and capacitor 90 will be charged to the source voltage, as described above. As FET's 50 and 60 are biased "off" and 45 and 55 are biased "on", the voltage $2V_s$ is applied to line 95 through FET's 45 and 55 and capacitor 90 which was previously charged to 100 volts. By repeating this process, a zero to 200 volt square wave is generated at line 95. Diodes 70 and 75 are not required for the zero to 200 volt square wave operation and can be omitted.

Thus, the single-sided sustainer in accordance with the present invention allows a zero to 200 volt swing using only 100 volt FET's in a single-sided configuration, whereby the vertical axis may remain grounded. Only one transistor more per display unit is required than a system which uses 200 volt FET's inasmuch as the 200 volt design would require a separate return-to-midpoint transistor. Furthermore, the circuit in accordance with the present invention requires only a single high voltage power supply at 100 volts to produce the RTM waveform rather than the typical $V_s$ and $2V_s$ power supplies regulated to $\pm 1\%$, as is conventionally done in RTM.

Various changes, additions and omissions of relevance may be made within the scope and spirit of this invention. It is to be understood that the invention is not limited to specific details, examples and preferred embodiments shown and described herein.

We claim:

1. A circuit for providing a sustain voltage waveform for a gas discharge display panel comprising:
   (a) first (45), second (50), third (55) and fourth (60) switches each having an input, output and control port, the output of said first switch connected to the input of said second switch and to the output of said fourth switch, the output of said second switch applied to ground;
   (b) a first diode connected between the input of said first switch and the input of said third switch;
   (c) a first axis line connected on one hand to a first side of a gas discharge cell, and on the other hand to the output of said third switch and the input of said fourth switch;
   (d) a capacitor connected between the input of said third switch and the output of said fourth switch;
   (e) a source of voltage applied to the input of said first switch; and
   (f) a second axis line applying a second side of said gas discharge cell to ground.

2. The circuit of claim 1 wherein substantially a zero voltage and a voltage of twice said source of voltage are selectively applied across said gas discharge cell under the selective control of said first, second, third, and fourth switches.

3. The circuit of claim 1 further comprising a second diode connected between the input of said third switch and said first axis line, and a third diode connected between the output of said fourth switch and said first axis line, whereby substantially a zero voltage, a voltage equal to said source voltage, and a voltage of twice said source voltage are selectively applied across said gas discharge cell under the selective control of said first, second, third and fourth switches.

* * * * *